(12) United States Patent
Mann et al.

(10) Patent No.: US 8,866,654 B2
(45) Date of Patent: Oct. 21, 2014

(54) APPARATUS FOR ANALOG-TO-DIGITAL CONVERSION WITH A HIGH EFFECTIVE-SAMPLE-RATE ON THE LEADING EDGE OF A SIGNAL PULSE

(75) Inventors: Gregory J. Mann, Wheaton, IL (US); Gin-Chung Wang, Grayslake, IL (US)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 841 days.

(21) Appl. No.: 13/091,928

(22) Filed: Apr. 21, 2011

(65) Prior Publication Data

US 2012/0268105 A1 Oct. 25, 2012

(51) Int. Cl.
*H03M 1/00* (2006.01)
*G01T 1/17* (2006.01)
*H03M 1/12* (2006.01)

(52) U.S. Cl.
CPC .. *G01T 1/17* (2013.01); *H03M 1/00* (2013.01); *H03M 1/12* (2013.01); *H03M 2201/4233* (2013.01)
USPC .......................................... 341/126; 341/155

(58) Field of Classification Search
CPC .. H03M 1/12; H03M 1/00; H03M 2201/4233
USPC ................... 341/126, 120, 155, 166
See application file for complete search history.

(56) References Cited

U.S. PATENT DOCUMENTS

2004/0017224 A1* 1/2004 Turner et al. ................. 327/51

FOREIGN PATENT DOCUMENTS

JP 2002-267757 9/2002

OTHER PUBLICATIONS

International Search Report issued Jun. 19, 2012, in Application No. PCT/JP2012/060771.
Qingguo Xie, et al., "A New Approach for Pulse Processing in Positron Emission Tomography", IEEE Transactions on Nuclear Science, vol. 52, No. 4, Aug. 2005, pp. 988-995.
Qingguo Xie, et al., "Potentials of Digitally Sampling Scintillation Pulses in Timing Determination in PET", IEEE Transactions on Nuclear Science, vol. 56, No. 5, Oct. 2009, pp. 2607-2613.
U.S. Appl. No. 13/343,541, filed Jan. 4, 2012, Burr, et al.
U.S. Appl. No. 13/091,985, filed Apr. 21, 2011, Burr, et al.
U.S. Appl. No. 13/153,611, filed Jun. 6, 2011, Gagnon, et al.

* cited by examiner

*Primary Examiner* — Joseph Lauture
(74) *Attorney, Agent, or Firm* — Oblon, Spivak, McClelland, Maier & Neustadt, L.L.P.

(57) ABSTRACT

A method and electronic device for outputting time values and energy of an analog input signal by dynamically determining a plurality of threshold values, comparing, using a plurality of comparator circuits, the plurality of threshold values against the analog input signal, outputting, using at least one time to digital conversion circuit connected to each of the plurality of comparator circuits, a plurality of time values, each time value output when the analog input signal meets or exceeds a threshold value of the threshold values, filtering the analog input signal, performing, using an analog-to-digital conversion circuit, analog-to-digital conversion of the filtered analog input signal to generate a digital signal, and calculating, in response to receiving a trigger signal, an energy of the digital signal.

20 Claims, 11 Drawing Sheets

APPARATUS FOR ANALOG-TO-DIGITAL CONVERSION WITH A HIGH EFFECTIVE-SAMPLE-RATE ON THE LEADING EDGE OF A SIGNAL PULSE

CROSS-REFERENCE TO RELATED APPLICATIONS

This application is related to the applications entitled "Timing Pick-off of Undersampled Pulses" U.S. patent application Ser. No. 13/343,541, and "Detection of Leading Edge of PMT Output" U.S. patent application Ser. No. 13/091,985, the contents of which are incorporated herein by reference.

FIELD

The embodiments described herein relate generally to a system and a method of obtaining timestamp values from a PMT signal.

BACKGROUND

In PET imaging, or positron emission tomography, a radiopharmaceutical agent is administered, via injection, inhalation and/or ingestion, to a patient. The physical and bio-molecular properties of the agent then concentrate at specific locations in the human body. The actual spatial distribution, intensity of the point and/or region of accumulation, as well as the kinetics of the process from administration and capture to eventual elimination, all have clinical significance. During this process, the positron emitter attached to the radiopharmaceutical agent emits positrons according to the physical properties of the isotope, such as half-life, branching ratio, etc. Each positron interacts with an electron of the object, is annihilated and produces two gamma rays at 511 keV, which travel at substantially 180 degrees apart. The two gamma rays then cause a scintillation event at a scintillation crystal of the PET detector, which detects the gamma rays thereby. By detecting these two gamma rays, and drawing a line between their locations or "line-of-response," the likely location of the original annihilation is determined. While this process only identifies one line of possible interaction, accumulating a large number of these lines, and through a tomographic reconstruction process, the original distribution is estimated with useful accuracy. In addition to the location of the two scintillation events, if accurate timing—within few hundred picoseconds—is available, time-of-flight calculations are also made in order to add more information regarding the likely position of the annihilation event along the line. Limitations in the timing resolution of a scanner determines the accuracy of the positioning along this line. Limitations in the determination of the location of the original scintillation events determines the ultimate spatial resolution of the scanner. A specific characteristic of the isotope (for example, energy of the positron) contributes (via positron range and co-linearity of the two gamma rays) to the determination of the spatial resolution for a specific radiopharmaceutical agent.

The above process is repeated for a large number of annihilation events. While every case needs to be analyzed to determine how many scintillation events are required to support the desired imaging tasks, conventionally a typical 100 cm long, FDG (fluoro-deoxyglucose) study accumulates about 100 millions counts or events. The time required to accumulate this number of counts is determined by the injected dose, as well as the sensitivity and counting capacity of the scanner.

PET imaging relies on the conversion of gamma rays into light through fast and bright scintillation crystals, generating the scintillation events referred to above. Time-of-Flight (ToF) PET further requires sub-nanosecond timing resolution and resolutions of a few hundred picoseconds is also being contemplated. While it is complicated enough to tune and adjust two channels of scintillating crystal, photomultiplier tubes (PMT), and electronics, this complexity is only increased on a large arrays of crystals and sensors.

Modern PET systems support 500-600 ps timing resolutions. At this level, even small timing variations in the components are significant, and transit time is the most important variable in this equation. Transit time is the average time between when a photon strikes the photocathode of a PMT and when the corresponding current pulse is measured at the anode of the PMT. The variation of this quantity from one PMT to another causes the signals to reach the analysis circuitry at different times.

The need for an accurate transit time of the detection chain is often offset by internal or intrinsic ballistic differences between the crystal location relative to shortest and longest optical paths to the sensor. This is a complex theoretical estimation to perform, but measurements suggest that 25 to 40 ps is the inherent timing variation related to optical path. Therefore, 25-40 ps accuracy in balancing the transit time of all the channels of the detector is a reasonable target. Any additional accuracy is useful, but has a marginal—if not negligible—effect on system performance.

Conventionally, arrival time determination of PMT output signals is difficult to achieve with significant accuracy because of the limitations of discrete elements. Moreover, with current ADC sample rate technology, only a small number of samples will fall within the leading edge of the PMT output signal, thus providing low-quality time stamp determination.

BRIEF DESCRIPTION OF THE DRAWINGS

A more complete appreciation of the disclosed embodiments and many of the attendant advantages thereof will be readily obtained as the same becomes better understood by reference to the following detailed description when considered in connection with the accompanying drawings, wherein.

DETAILED DESCRIPTION

Figure 1:
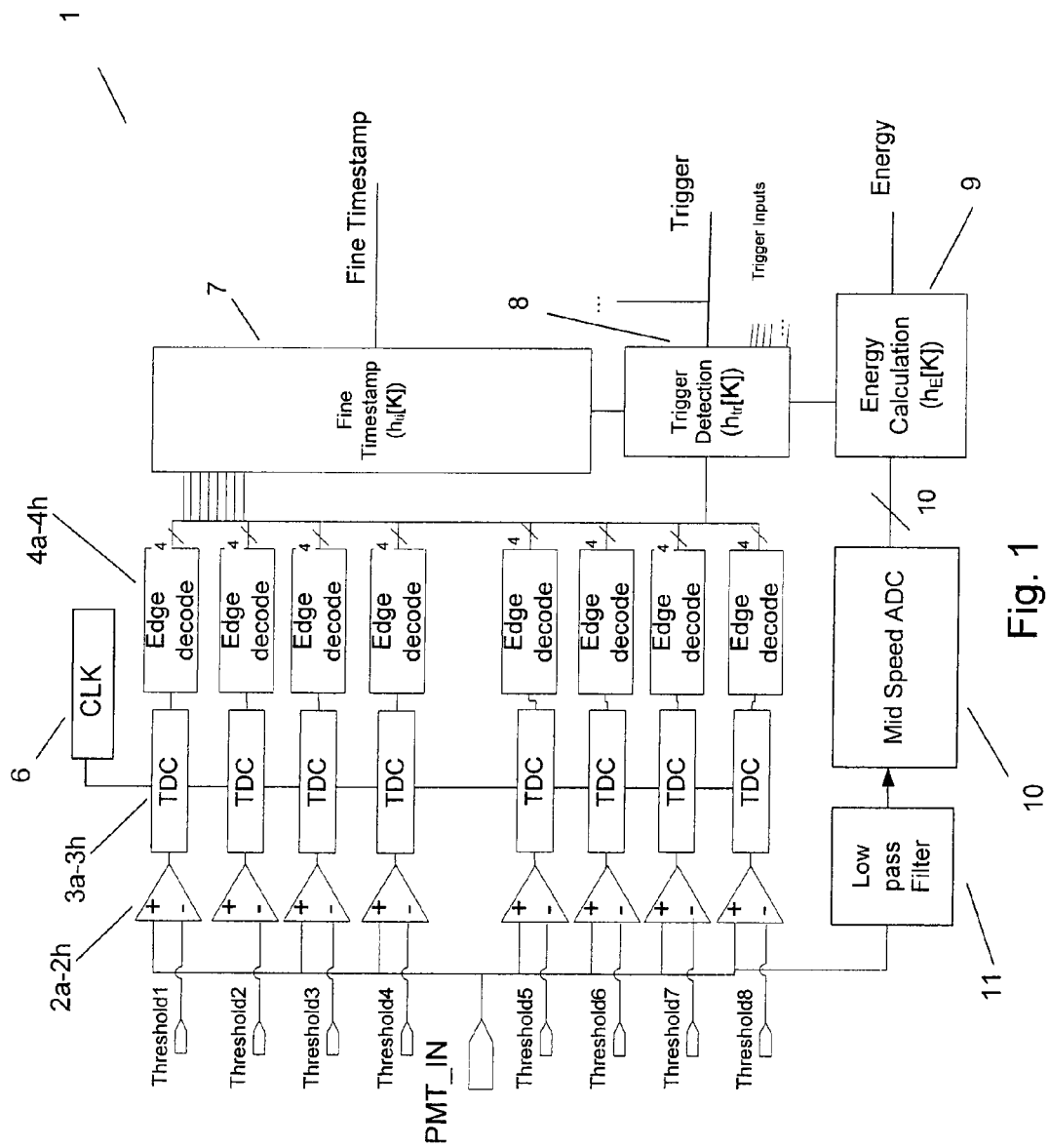
FIG. 1 is a schematic drawing of an exemplary system according to one embodiment.

In one embodiment, an electronic device such as a semiconductor device is described. Included in the semiconductor device is a threshold determination unit that dynamically determines a plurality of threshold values, a plurality of comparator circuits that each compares a corresponding threshold value of the plurality of threshold values against an analog input signal, and at least one time-to-digital conversion circuit that is connected to each of the plurality of comparator circuits and that outputs a plurality of time values, each time value output when the analog input signal meets or exceeds a threshold value of the plurality of threshold values. Also included in the semiconductor device is an adjustable low-pass filtering unit that filters the analog input signal, an analog-to-digital conversion circuit that is connected to the low-pass filtering unit and that performs analog-to-digital conversion of the filtered analog signal to generate a digital signal, and an energy calculation unit that calculates, in response to receiving a trigger signal, an energy of the digital signal.

In another embodiment, there is described a fine timestamp unit that receives the plurality of time values and processes the time values for output, the processing including one of combining the plurality of time values using a weighing process, and grouping the plurality of time values such that each time value is independently reconstructable.

In another embodiment, there is described a trigger detection unit that detects an event by analyzing the plurality of time values output by the at least one time-to-digital conversion circuit.

In another embodiment, the trigger detection unit is further described as outputting a trigger signal to an external device when the event is detected.

In another embodiment, the trigger detection unit is further described as receiving a trigger signal sent from an external device when an event is detected by the external device.

In another embodiment, the threshold determination unit is further described as dynamically determining the plurality of threshold values.

In another embodiment, the threshold determination unit is further described as dynamically determining the plurality of threshold values such that the threshold values are uniformly spaced.

In another embodiment, the threshold determination unit is further described as dynamically determining the plurality of threshold values such that the threshold values are non-uniformly spaced.

In another embodiment, the threshold determination unit is further described as dynamically determining the plurality of threshold values such that the threshold values are closer together near a leading edge of pulse.

Further, according to another embodiment, there is described a method for outputting time values and energy of an analog input signal. Included in the method are the steps of dynamically determining a plurality of threshold values, comparing, using a plurality of comparator circuits, the plurality of threshold values against the analog input signal, outputting, using at least one time to digital conversion circuit connected to each of the plurality of comparator circuits, a plurality of time values, each time value output when the analog input signal meets or exceeds a threshold value of the threshold values, filtering the analog input signal, performing, using an analog-to-digital conversion circuit, analog-to-digital conversion of the filtered analog input signal to generate a digital signal, and calculating, in response to receiving a trigger signal, an energy of the digital signal.

Further, according to another embodiment, there is described an electronic device that includes a threshold determination unit that dynamically determines a plurality of threshold values, a plurality of comparator circuits that each compare a corresponding threshold value of the plurality of threshold values against an analog input signal, a plurality of time-to-digital conversion circuits that each are connected to a corresponding one of the plurality of comparator circuits and that output a plurality of time values, each time value output when the analog input signal meets or exceeds a threshold value of the threshold values, an adjustable low-pass filtering unit that filters the analog input signal, an analog-to-digital conversion circuit that is connected to the low-pass filtering unit and that performs analog-to-digital conversion of the filtered analog input signal to generate a digital signal, and an energy calculation unit that calculates, in response to receiving a trigger signal, an energy of the digital signal.

Referring now to the drawings wherein like reference numbers designate identical or corresponding parts throughout the several views and more particularly to FIG. 1 thereof, there is illustrated an apparatus in which multiple time-to-digital (TDC) circuits are integrated onto a semiconductor device 1 (e.g. a silicon device).

The silicon device operates in tandem with a radiation detector (e.g., a PET detector including of PMTs and scintillator arrays) and is designed to provide the arrival time (timing) and intensity (energy) of an interaction. These values are extracted by processing the electronic pulse coming out of the photosensors. The electronic pulses output from the photosensors usually have a fast rising edge and a slower falling tail due to the nature of the scintillator light output. The information of the arrival time (time of interaction) is mainly included in the fast rising edge, while the information about the intensity (energy) of the radiation is included in the whole pulse.

In order to accurately estimate the arrival time, the leading edge of the pulse is sampled with a fast rate. Thus the important information (timing and energy) of an electrical pulse is obtained by taking a limited number of samples of the leading edge with high timing accuracy and sampling the rest of the pulse at a much lower sampling rate. This method retains the critical information of the pulse (timing and energy) without the need to sample the whole pulse at a high homogeneous rate.

FIG. 1 shows a semiconductor device 1, which receives the electronic pulses PMT_IN from the radiation detector. Each electronic pulse PMT_IN is received by the plurality of comparators 2A-H. Each comparator 2 is also connected to a threshold signal (Threshold1-8). Each threshold signal (Threshold1-8) is individually determined such that the threshold signals can target particular portions of the amplitude range of the electronic pulse received at PMT_IN. Each comparator 2 output is connected to a TDC (time-to-digital converter) circuit 3A-H. The TDC circuits 3A-H (time-to-digital converters) produce a digital output that encodes the time of the electronic pulse crossed the respective threshold relative to a system clock 6. For a time-of-flight PET system, the TDC typically produces a time stamp with an accuracy of 15 to 25 ps. Thus, the TDC circuits 3A-H are connected to internal threshold comparator signals internal to an ADC circuit (e.g., comparator outputs of flash ADC or a first stage of a sub-ranging ADC). By attaching a plurality of TDC circuits 3A-H to the comparator signals, significantly more samples of the leading edge of the signal can be obtained. In addition, the threshold values used can be non-uniformly spaced, allowing for specific targeting of regions of the signal amplitude range for high time resolution. As a high fixed sample rate of the signal is not required, realizations in CMOS semiconductor processes can be used, thus resulting in significantly higher digital performance for analysis of digitized data. In other words, as this embodiment does not require an ADC core with a homogeneous high sampling rate, this embodiment can be achieved using a lower cost CMOS semiconductor devices as well as by high cost semiconductor devices (BiCMOS). The edge decode circuit 4a-4h are decoders which provide edge decoding. In particular, the decoders 4a-4h pack (decode) the edge pattern from the TDC into more compact form. The decoders 4a-4h additionally determine whether the amplitude of the signal crossed the respective threshold low to high, or high to low.

Detailed descriptions of the comparator section (including comparators 2A-H), the time-to-digital conversion section (including TDC circuits 3A-H, edge decode circuits 4a-h and fine timestamp unit 7), the analog to digital conversion section (including the low-pass filter 11, mid-speed ADC 10 and energy calculation unit 9), and the trigger detection section are set forth below.

Figure 2:
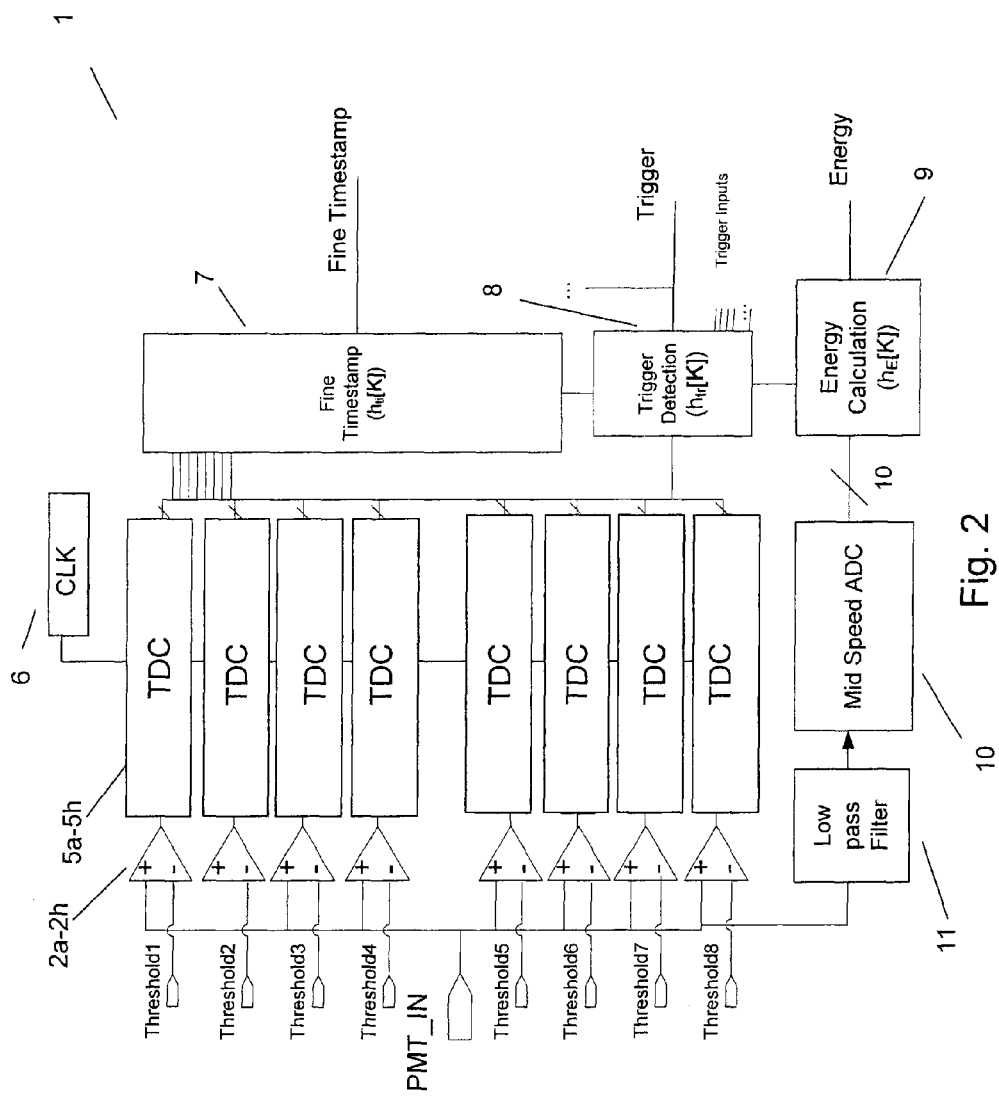
FIG. 2 is a schematic drawing of an exemplary system according to another embodiment.

FIG. 2 illustrates an embodiment of the semiconductor device 1 in which the TDC circuit 3a-3h and the edge decode circuit 4a-4h are replaced with a TDC circuit 5a-h. The TDC circuit 5a-h can be one of a plurality of different types of time-to-digital converter circuits. The TDC circuits may be Dual slope/ramp TDC, Multi slope/ramp, TDC Tapped delay line TDC, or Stochastic TDC, etc., however the TDC will most likely be of a tapped delay line design. In addition, the TDC circuit 5a-h has included therein a coder or a decoder that outputs a digital signal to be used by the fine timestamp unit 7.

Figure 3:
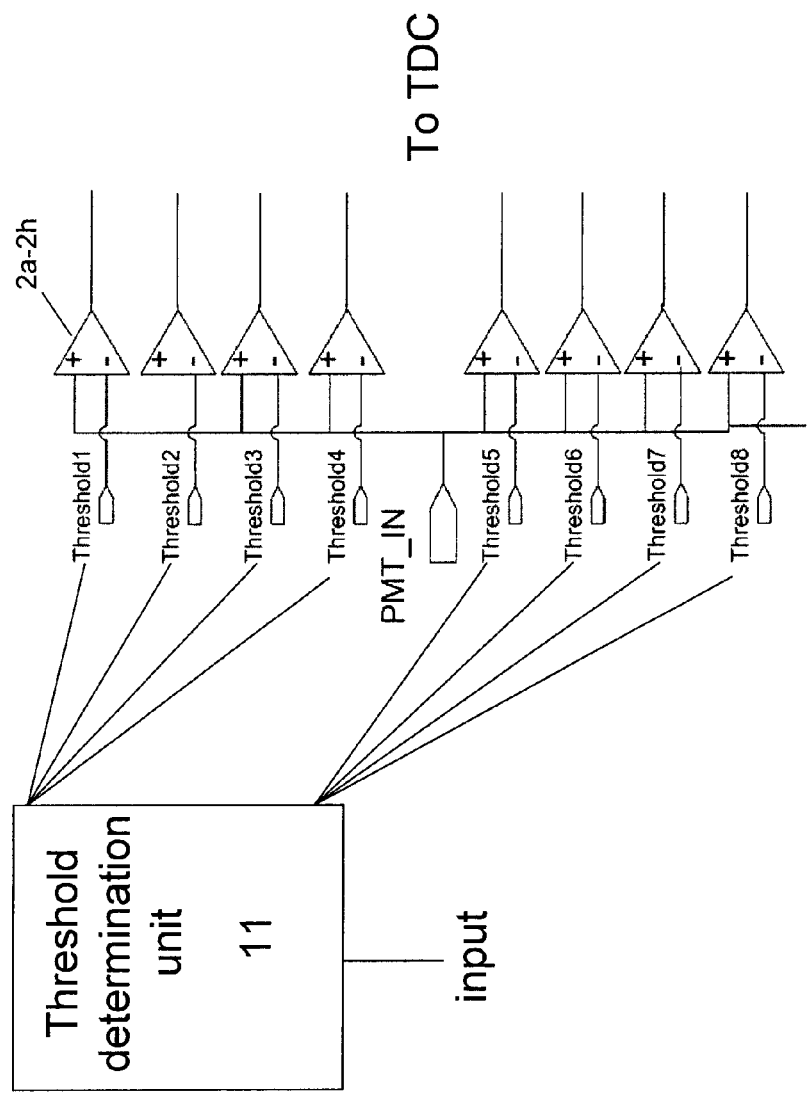
FIG. 3 is a schematic drawing focusing on a comparator section of one embodiment.

FIG. 3 illustrates the comparator section in one embodiment. The comparator section includes the comparators 2a-2h and the threshold inputs in which thresholds (Threshold1-8) are input into the comparators. The thresholds (Threshold1-8) are configurable to be adjustable or set. The thresholds are adjustable by the threshold determination unit 11. In addition, the thresholds can be adjustable based on external input to the threshold determination unit, which reprograms the thresholds so that certain portions of the signal can be focused upon or can be adjustable based on predetermined algorithms that make a determination regarding how the thresholds should be set. For example, the thresholds can be set based on models and correlations that are preprogrammed into the device. In addition, the thresholds can be dynamically adjusted based on the count rate of the signal, rise time of the signal, or the maximum amplitude of the signal.

In one embodiment, the comparators 2a-2h are comparator outputs of flash ADC or a first stage of a sub-ranging ADC. Comparators such as LVDS receivers or more general receivers for differential signals could also be used as the comparators 2a-2h.

Figure 4:
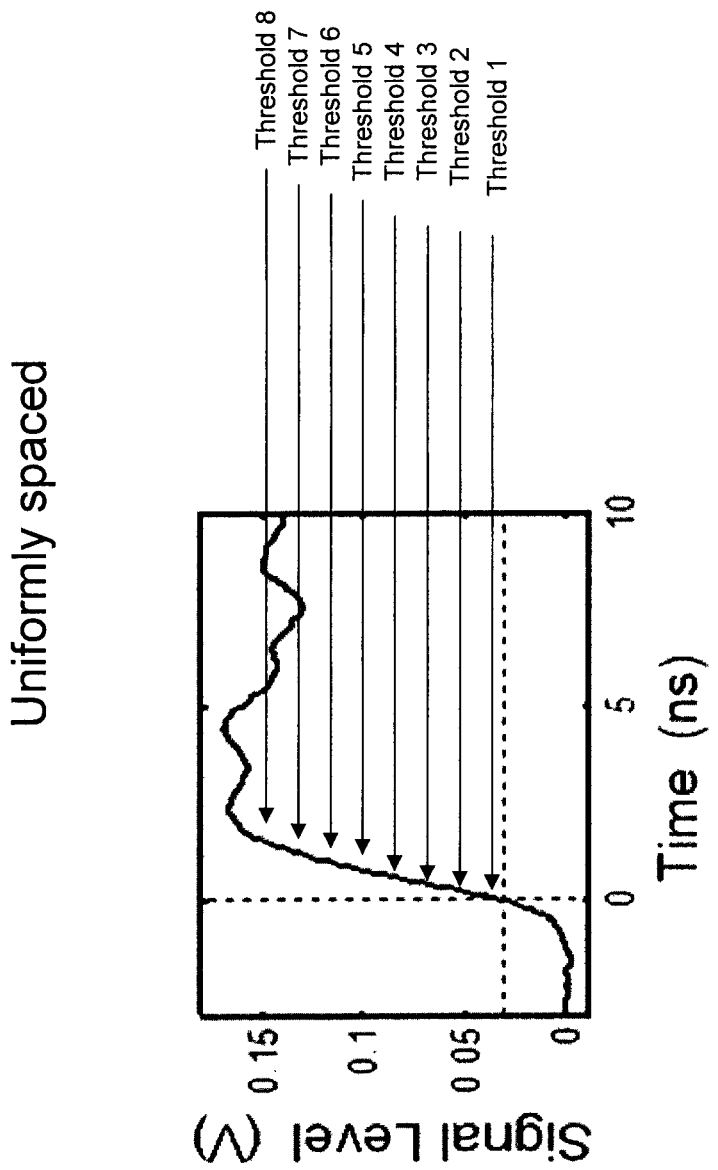
FIG. 4 illustrates threshold values on a signal where the threshold values are uniformly spaced.
Figure 5:
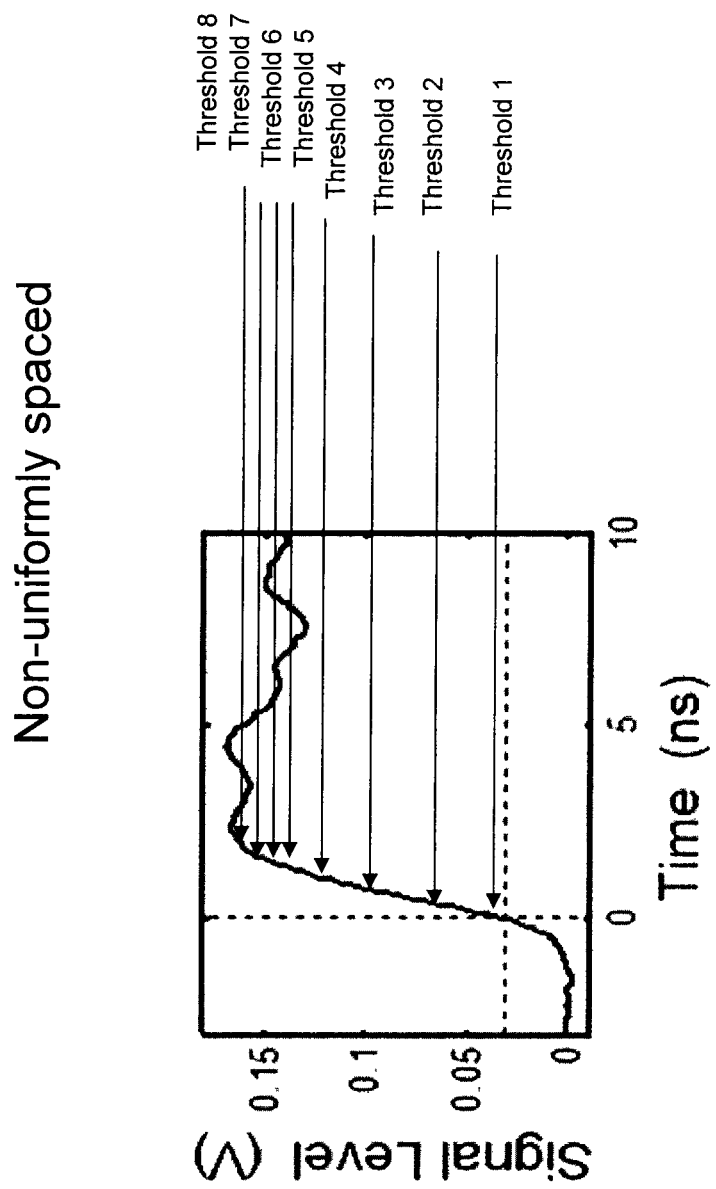
FIG. 5 illustrates threshold values on a signal where the threshold values are non-uniformly spaced.

As is shown in FIGS. 4 and 5, the thresholds are applied to the signal received at PMT_IN in either a uniformly spaced schema (FIG. 4) or a non-uniformly spaced schema (FIG. 5). The placement of the thresholds enables information to be obtained from the signal in a particular way. For example, if information about the very top of the rise in the signal is important, the thresholds can be set such that they cluster around this point (see FIG. 5, thresholds 5-8).

Figure 6:
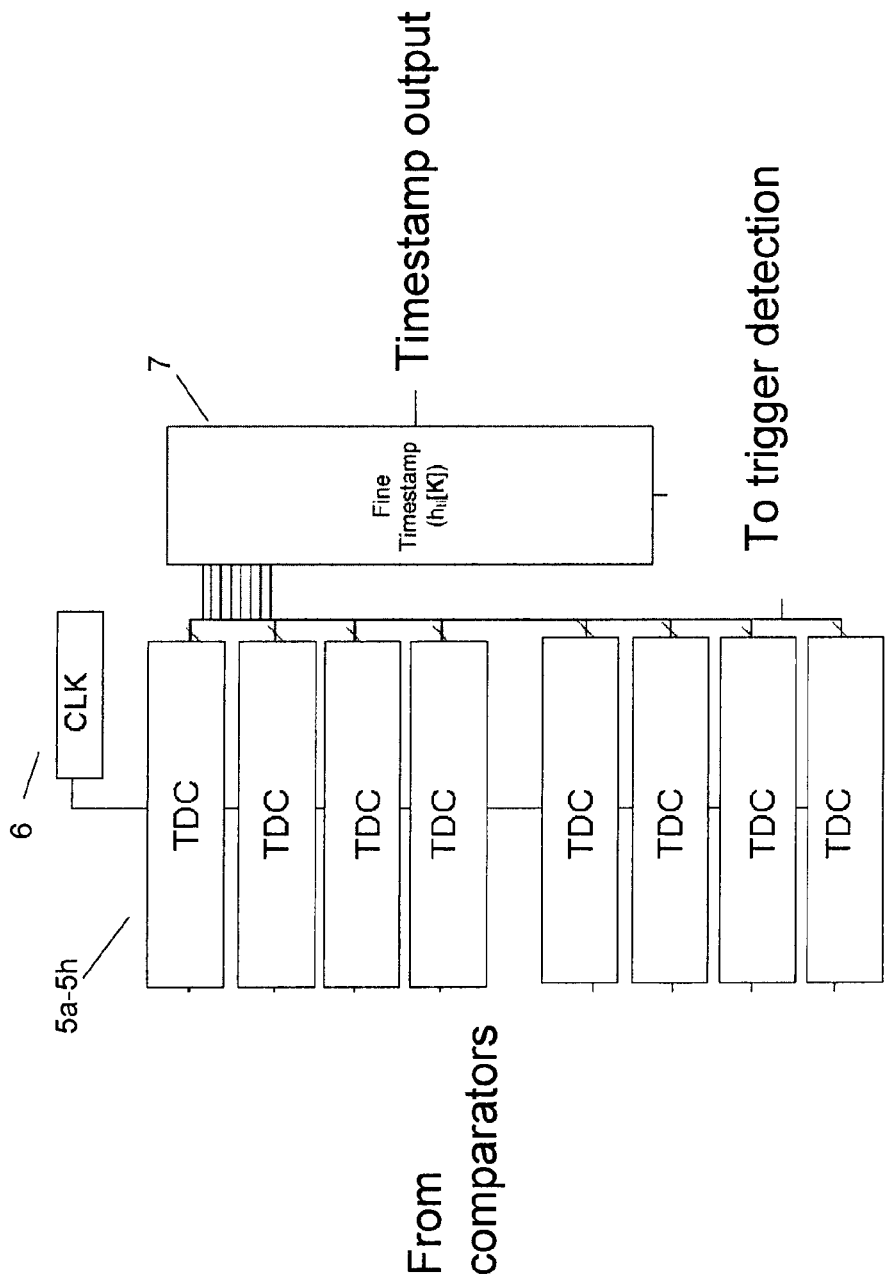
FIG. 6 is a schematic drawing focusing on a time to digital conversion section of one embodiment.

The positive or negative determinations made by the comparators are detected by the time-to-digital conversion section illustrated in FIG. 6. Specifically, the TDC circuits 5a-5h utilize the signal output by comparator circuits 2a-h and the clock signal output by the clock 6 to output a timing value to the fine timestamp unit 7. For example, the TDC circuits 5a-h each detect a pulse output by the comparators 2a-2h. If the signal crosses the respective threshold the timing value corresponding to this crossing is transmitted to the fine timestamp unit 7. The fine timestamp unit 7 then calculates a fine timestamp by weighting (an FIR type of digital processing) the measured timing values from the TDCs. Alternatively, the fine timestamp unit 7 is able to pack the timing values from the TDCs for sending to the next stage.

In addition, the TDC circuits 5a-5h can be replaced with a single multi-hit TDC to which the comparators 2a-h can be coupled. Further, irrespective of whether multiple TDC circuits 5a-5h are used or a single multi-hit TDC, the accuracy of the TDCs can be adjusted to accommodate a variety of detector speeds (e.g., detectors using different scintillators have different rise times in their signals). For example, the accuracy of the TDC can be adjusted by changing the capacitor value of the dual slope TDC, or combining delay units in the tapped delay line TDC.

The output of the TDCs 5a-5h may be transmitted to the trigger detection section to detect if a valid trigger condition is met. The trigger detection section may also transmit a signal to enable the output of the fine timestamp unit 7 when a valid trigger condition is met. In addition, the result of the trigger detection section is transmitted to the energy calculation unit 9. This transmission activates the energy calculation unit 9 and is discussed in more detail below. The energy calculation unit 9 is included in the analog-to-digital converter section.

Figure 7:
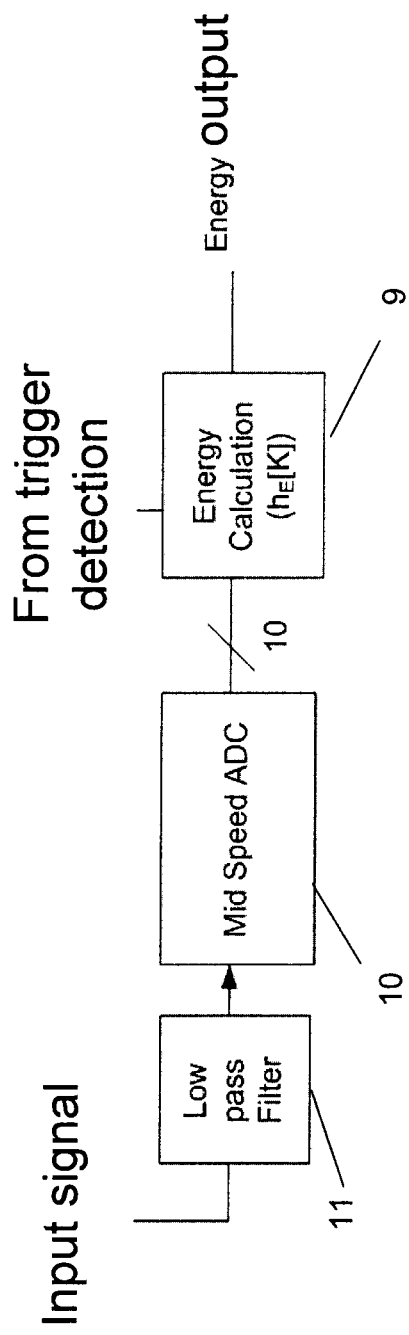
FIG. 7 is a schematic drawing focusing on an analog to digital conversion section of one embodiment.

FIG. 7 illustrates the analog-to-digital converter section, which includes the low-pass filter 11, the mid-speed ADC 10, and the energy calculation unit 9.

An energy calculation is performed in response to a message from the trigger detection unit 8. The message from the trigger detection unit 8 could be initiated by a trigger detection locally at the trigger detection unit or the trigger could be initiated by a request from a neighboring chip or device.

The plurality of comparator and TDC combinations effectively provide a high sampling rate to the leading edge. The thresholds of comparators 2a-h are programmed to capture the portion of the leading edge that contains the most important timing information. In order to obtain the energy of the interaction, an ADC, such as a mid-speed ADC 10, with moderate sampling rate can be used to capture the whole waveform. Alternatively, a high-speed ADC can be used in place of the ADC. However, one advantage of the system 1 is that a mid range ADC can be used instead of a high-speed ADC. The speed of the ADC core is adjustable to save energy when a slower detector is used. For example, a slow detector such as a BGO-scintillator-based detector can be sampled at a much lower rate than an LYSO scintillator based detector. Energy information is thus calculated by digitally processing the samples.

In the analog-to-digital converter section the input signal is received by a low-pass filter 11. This low pass filter 11 has adjustable corner frequencies to accommodate the nature of the radiation/photo detector (which outputs the signal) and also to optimize the performance at different count rates (number of annihilation events). The filtered signal is then received by the ADC 10 which performs analog-to-digital conversion on the entire signal. The digital output of the ADC 10, is received by the energy calculation unit 9, which utilizes a configurable digital processing unit to calculate the energy of the electronic pulses output from the photodetector and included in the signal. The energy calculation unit 9 has a count-rate-dependent kernel that is used to estimate the energy. For example, the count-rate-dependent kernel can determine the particular functions/parameters used in the energy calculation based the count rate. Thus, the weighting functions/parameters (e.g., FIR-based filter etc.) used to calculate the energy are count rate dependent.

Figure 8:
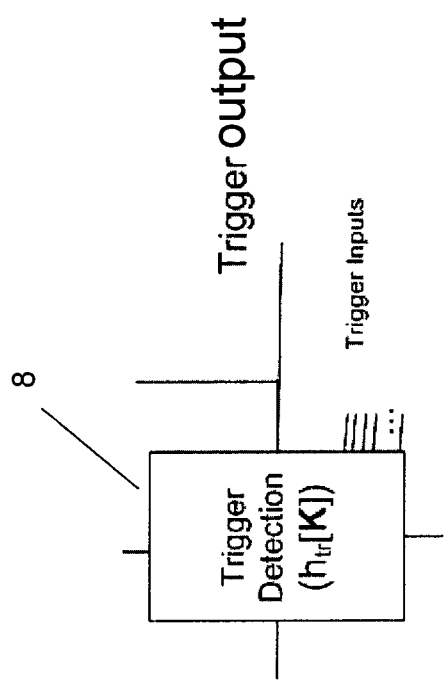
FIG. 8 is a schematic drawing focusing on a trigger detection section of one embodiment.

FIG. 8 illustrates the trigger detection section of the semiconductor device 1. Included in the trigger detection section is the trigger detection unit 8. The trigger detection unit 8 is able to receive trigger inputs from external trigger detection devices and to output trigger information calculated at the trigger detection unit 8 to external trigger detection devices. The trigger detection unit 8 performs local trigger detection based on the information received from the TDC circuits 5*a-h*. For example, when one or more of the thresholds is met in the comparison performed by the comparator circuits 2*a-h*, the trigger detection unit 8 makes a determination that an event has occurred based on the signal level. This information is then output to the energy calculation unit 9 and the trigger output. The trigger detection unit 8 also sends out locally calculated trigger signals to the neighboring devices and chips when a trigger condition is met.

In addition, the trigger detection unit communicates with the fine timestamp unit 7 to verify that the signals received from the TDC circuits 5*a-h* are indeed activating the trigger in the trigger detection unit 8. In order to account for noise and other factors, the trigger detection unit 8 can verify using the weighed values of the fine timestamp unit 7 that the trigger actually has occurred.

In another embodiment, the trigger detection unit is able to wake-up the fine timestamp unit 8 and the energy calculation unit 9 which are in power-save mode in response to detecting a trigger.

Figure 9A:
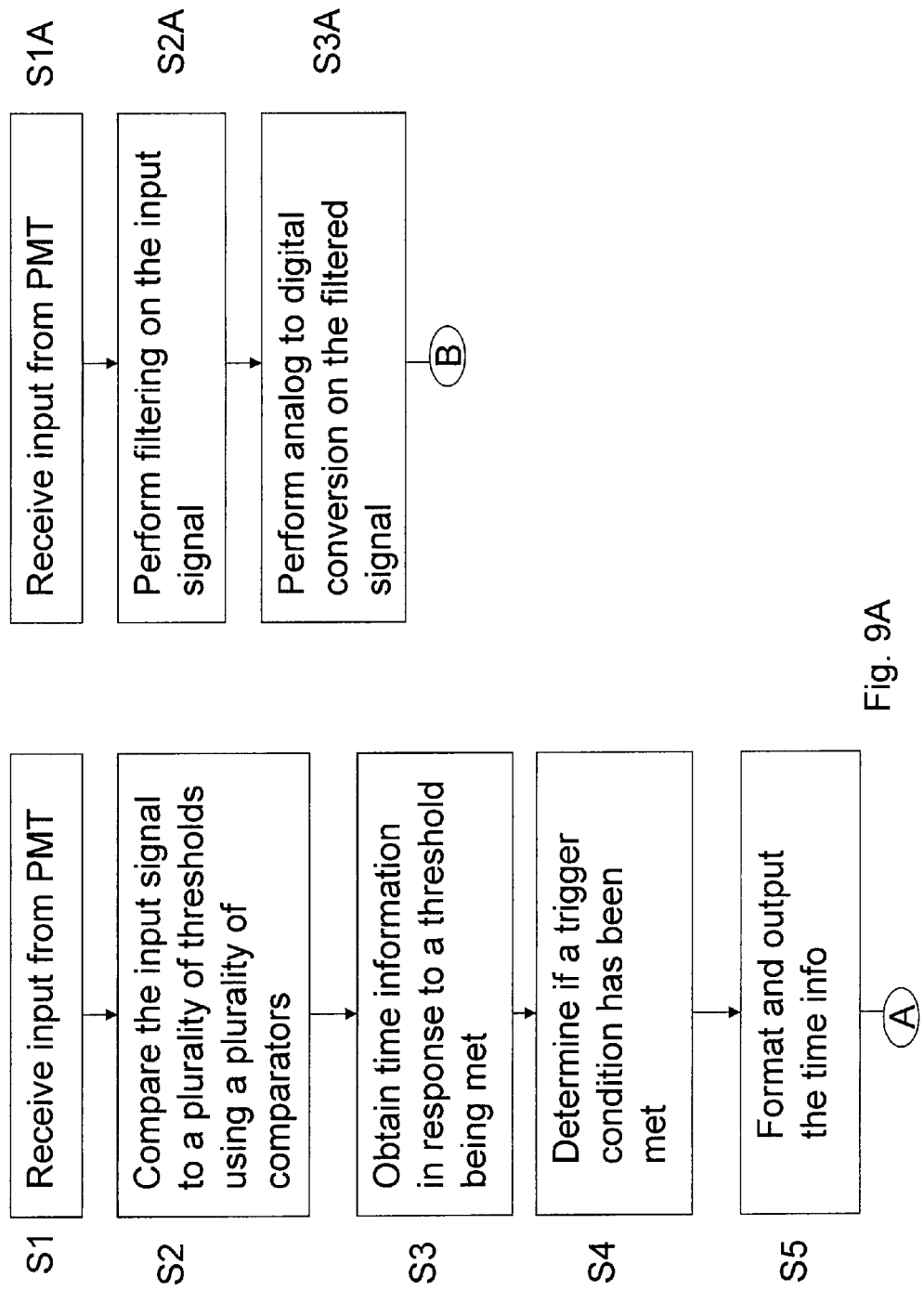
FIG. 9A illustrates steps in a method according to an embodiment described herein.
Figure 9B:
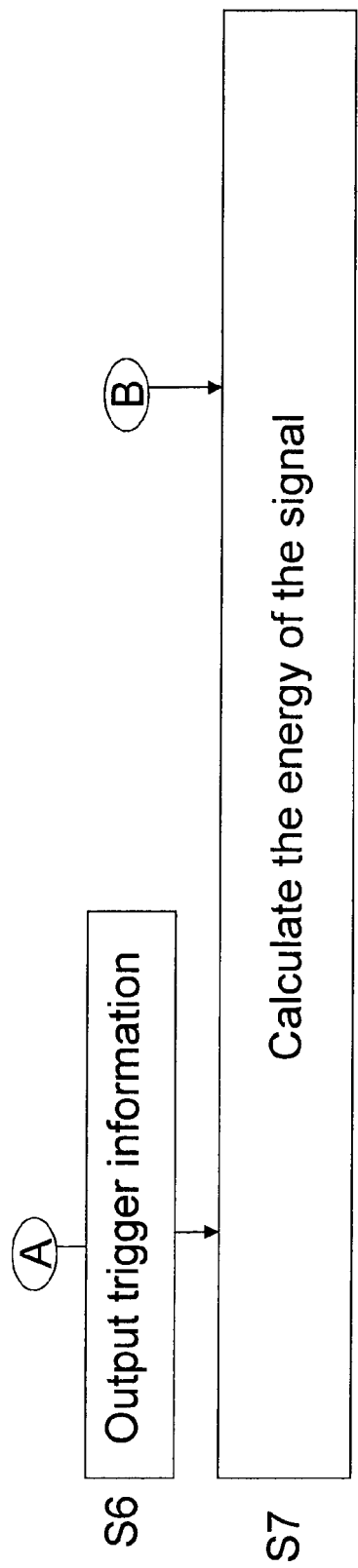
FIG. 9B illustrate steps in a method according to an embodiment described herein.
Figure 10:
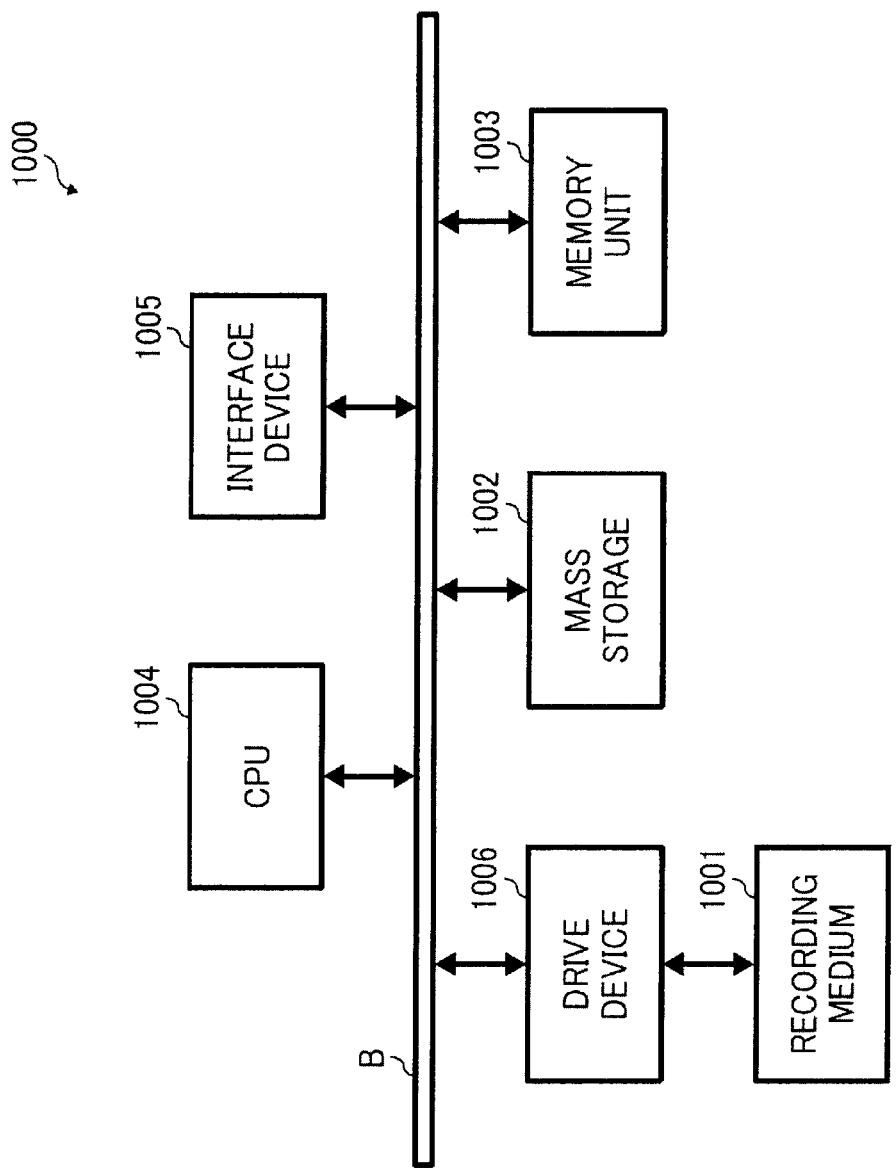
FIG. 10 illustrates a computer system according to one embodiment.

FIGS. 9A-B illustrate the overall method of one embodiment described herein. In step S1, an input signal is received at PMT_IN from the PMT.

In step S2, the input signal is split and compared against a plurality of thresholds. The thresholds could be the same value, a combination of the same value and different values or more typically all different values. In response to the input signal crossing a threshold at a comparator, the comparator outputs a pulse which is received at a corresponding TDC.

In step S3, the TDC obtains time information in response to the threshold being met. The time information, in step S4, is output to the trigger detection unit, which uses the time information to determine if a trigger condition has been met or receives information from a neighboring device that initiates the trigger.

This time information is concurrently output to the fine timestamp unit which, in step S5, formats the time information by either applying a weighing algorithm to the values to receive a combined value or packing all the values together such the values are independently maintained. Further, the formatted time information is output.

In step S6, in response to the trigger condition being met, the trigger information is output.

In step S7, in response to the trigger condition being met, the energy of the signal is calculated using the information obtained from the ADC. The ADC process is illustrated in steps S1A-3A. In step S1A, the input signal is received from the PMT. The input signal is then filtered in step S2A. The filtered signal is received at the ADC and in step S3A, analog-to-digital conversion is preformed on the filtered signal. The ADC data is then used to calculate the energy of the signal. In addition, the trigger detection unit 8 can send a message to the energy calculation unit 9 to stop the energy calculation. Thus, the energy calculation unit 9 can perform targeted energy calculation of the event based on information received from the trigger detection unit 8.

At least the low-pass filter, the trigger detection unit, the energy calculation unit, and the fine timestamp unit can be implemented using some form of digital logic. As one of ordinary skill in the art would recognize, the digital logic can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or CPLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the digital logic could be realized with a combination of digital circuitry and computer/digital signal processor that may execute a computer program including a set of computer-readable instructions that perform the functions described herein, the program being stored in any of the above-described non-transitory electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xenon processor from Intel of America or an Opteron processor from AMD of America and an operating system, such as Microsoft VISTA, UNIX, Solaris, LINUX, Apple, MAC-OSX and other operating systems known to those skilled in the art.

In addition, certain features of the embodiments can be implemented using a computer based system 1000. The computer 1000 includes a bus B or other communication mechanism for communicating information, and a processor/CPU 1004 coupled with the bus B for processing the information. The computer 1000 also includes a main memory/memory unit 1003, such as a random access memory (RAM) or other dynamic storage device (e.g., dynamic RAM (DRAM), static RAM (SRAM), and synchronous DRAM (SDRAM)), coupled to the bus B for storing information and instructions to be executed by processor/CPU 1004. In addition, the memory unit 1003 may be used for storing temporary variables or other intermediate information during the execution of instructions by the CPU 1004. The computer 1000 may also further include a read only memory (ROM) or other static storage device (e.g., programmable ROM (PROM), erasable PROM (EPROM), and electrically erasable PROM (EEPROM)) coupled to the bus B for storing static information and instructions for the CPU 1004.

The computer 1000 may also include a disk controller coupled to the bus B to control one or more storage devices for storing information and instructions, such as mass storage 1002, and drive device 1006 (e.g., floppy disk drive, read-only compact disc drive, read/write compact disc drive, compact disc jukebox, tape drive, and removable magneto-optical drive). The storage devices may be added to the computer 1000 using an appropriate device interface (e.g., small computer system interface (SCSI), integrated device electronics (IDE), enhanced-IDE (E-IDE), direct memory access (DMA), or ultra-DMA).

The computer 1000 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer 1000 may also include a display controller coupled to the bus B to control a display, such as a cathode ray tube (CRT), for displaying information to a computer user. The computer system includes input devices, such as a keyboard and a pointing device, for interacting with a computer user and providing information to the processor. The pointing device, for example, may be a mouse, a trackball, or a pointing stick for communicating direction information and command selections to the processor and for controlling cursor movement on the display. In addition, a printer may provide printed listings of data stored and/or generated by the computer system.

The computer 1000 performs at least a portion of the processing steps of the invention in response to the CPU 1004 executing one or more sequences of one or more instructions contained in a memory, such as the memory unit 1003. Such instructions may be read into the memory unit from another computer readable medium, such as the mass storage 1002 or a removable media 1001. One or more processors in a multi-processing arrangement may also be employed to execute the sequences of instructions contained in memory unit 1003. In alternative embodiments, hard-wired circuitry may be used in place of or in combination with software instructions. Thus, embodiments are not limited to any specific combination of hardware circuitry and software.

As stated above, the computer 1000 includes at least one computer readable medium 1001 or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other medium from which a computer can read.

Stored on any one or on a combination of computer readable media, the present invention includes software for controlling the main processing unit 1004, for driving a device or devices for implementing the invention, and for enabling the main processing unit 1004 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code elements on the medium of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the CPU 1004 for execution. A computer readable medium may take many forms, including but not limited to, non-volatile media, and volatile media. Non-volatile media includes, for example, optical, magnetic disks, and magneto-optical disks, such as the mass storage 1002 or the removable media 1001. Volatile media includes dynamic memory, such as the memory unit 1003.

Various forms of computer readable media may be involved in carrying out one or more sequences of one or more instructions to the CPU 1004 for execution. For example, the instructions may initially be carried on a magnetic disk of a remote computer. An input coupled to the bus B can receive the data and place the data on the bus B. The bus B carries the data to the memory unit 1003, from which the CPU 1004 retrieves and executes the instructions. The instructions received by the memory unit 1003 may optionally be stored on mass storage 1002 either before or after execution by the CPU 1004.

The computer 1000 also includes a communication interface 1005 coupled to the bus B. The communication interface 1004 provides a two-way data communication coupling to a network that is connected to, for example, a local area network (LAN), or to another communications network such as the Internet. For example, the communication interface 1005 may be a network interface card to attach to any packet switched LAN. As another example, the communication interface 1005 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1005 sends and receives electrical, electromagnetic or optical signals that carry digital data streams representing various types of information.

The network typically provides data communication through one or more networks to other data devices. For example, the network may provide a connection to another computer through a local network (e.g., a LAN) or through equipment operated by a service provider, which provides communication services through a communications network. The local network and the communications network use, for example, electrical, electromagnetic, or optical signals that carry digital data streams, and the associated physical layer (e.g., CAT 5 cable, coaxial cable, optical fiber, etc). Moreover, the network may provide a connection to a mobile device such as a personal digital assistant (PDA) laptop computer, or cellular telephone.

While certain embodiments have been described, these embodiments have been presented by way of example only, and are not intended to limit the scope of the inventions. Indeed the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An electronic device, comprising:
a threshold determination unit configured to dynamically determine a plurality of threshold values;
a plurality of comparator circuits, each comparator circuit configured to compare a corresponding threshold value of the plurality of threshold values against an analog input signal;
at least one time-to-digital conversion circuit connected to each of the plurality of comparator circuits and configured to output a plurality of time values, each time value output when the analog input signal meets or exceeds a threshold value of the plurality of threshold values;
an adjustable low-pass filtering unit configured to filter the analog input signal;

an analog-to-digital conversion circuit connected to the low-pass filtering unit and configured to perform analog-to-digital conversion of the filtered analog input signal to generate a digital signal; and an energy calculation unit configured to calculate, in response to receiving a trigger signal, an energy of the digital signal.

2. The electronic device according to claim 1, further comprising:
a fine timestamp unit configured to receive the plurality of time values and process the time values for output, the processing including one of:
combining the plurality of time values using a weighing processing, and
grouping the plurality of time values such that each time value is independently reconstructable.

3. The electronic device according to claim 1, further comprising:
a trigger detection unit configured to detect an event by analyzing the plurality of time values output by the at least one time-to-digital conversion circuit.

4. The electronic device according to claim 3, wherein the trigger detection unit is further configured to output a trigger signal to an external device when the event is detected.

5. The electronic device according to claim 3, wherein the trigger detection unit is further configured to receive a trigger signal sent from an external device when an event is detected by the external device.

6. The electronic device according to claim 5, wherein the threshold determination unit is further configured to dynamically determine the plurality of threshold values.

7. The electronic device according to claim 1, wherein the threshold determination unit is further configured to dynamically determine the plurality of threshold values such that the threshold values are uniformly spaced.

8. The electronic device according to claim 1, wherein the threshold determination unit is further configured to dynamically determine the plurality of threshold values such that the threshold values are non-uniformly spaced.

9. The electronic device according to claim 8, wherein the threshold determination unit is further configured to dynamically determine the plurality of threshold values such that the threshold values are closer together near a leading edge of a pulse.

10. A method of outputting time values and energy of an analog input signal, comprising:
dynamically determining a plurality of threshold values;
comparing, using a plurality of comparator circuits, the plurality of threshold values against the analog input signal;
outputting, using at least one time-to-digital conversion circuit connected to each of the plurality of comparator circuits, a plurality of time values, each time value output when the analog input signal meets or exceeds a threshold value of the threshold values;
filtering the analog input signal;
performing, using an analog-to-digital conversion circuit, analog-to-digital conversion of the filtered analog input signal to generate a digital signal; and
calculating, in response to receiving a trigger signal, an energy of the digital signal.

11. The method according to claim 10, further comprising:
receiving the plurality of time values and processing the time values for output, the processing including one of:
combining the plurality of time values using a weighing processing, and
grouping the plurality of time values such that each time value is independently reconstructable.

12. The method according to claim 10, further comprising:
detecting an event by analyzing the plurality of time values output by the at least one time-to-digital conversion circuit.

13. The method according to claim 12, further comprising:
outputting a trigger signal to an external device when the event is detected.

14. The method according to claim 12, further comprising:
receiving a trigger signal sent from an external device when an event is detected by the external device.

15. The method according to claim 14, further comprising:
dynamically determining the plurality of threshold values.

16. The method according to claim 10, further comprising:
dynamically determining the plurality of threshold values such that the threshold values are uniformly spaced.

17. The method according to claim 10, further comprising:
dynamically determining the plurality of threshold values such that the threshold values are non-uniformly spaced.

18. The method according to claim 17, further comprising:
dynamically determine the plurality of threshold values such that the threshold values are closer together near a leading edge of a pulse.

19. The method according to claim 10, wherein the at least one time-to-digital conversion circuit includes a plurality of time-to-digital conversion circuits.

20. An electronic device, comprising:
a threshold determination unit configured to dynamically determine a plurality of threshold values;
a plurality of comparator circuits, each comparator circuit configured to compare a corresponding threshold value of the plurality of threshold values against an analog input signal;
a plurality of time-to-digital conversion circuits, each connected to a corresponding one of the plurality of comparator circuits and configured to output a plurality of time values, each time value output when the analog input signal meets or exceeds the corresponding threshold value;
an adjustable low-pass filtering unit configured to filter the analog input signal;
an analog-to-digital conversion circuit connected to the low-pass filtering unit and configured to perform analog-to-digital conversion of the filtered analog input signal to generate a digital signal; and
an energy calculation unit configured to calculate, in response to receiving a trigger signal, an energy of the digital signal.

* * * * *